(12) United States Patent
Huang et al.

(10) Patent No.: US 12,407,133 B2
(45) Date of Patent: Sep. 2, 2025

(54) CIRCUIT BOARD DEVICE FOR INSERTING AN EXPANSION CARD

(71) Applicant: ASUSTeK COMPUTER INC., Taipei (TW)

(72) Inventors: Feng Huang, Taipei (TW); Zhaowei Sheng, Taipei (TW); Wen-Ting Yu, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 319 days.

(21) Appl. No.: 18/351,477

(22) Filed: Jul. 12, 2023

(65) Prior Publication Data

US 2024/0380158 A1    Nov. 14, 2024

(30) Foreign Application Priority Data

May 8, 2023 (TW) ................................ 112204459

(51) Int. Cl.
*H01R 13/627* (2006.01)
*H01R 12/73* (2011.01)

(52) U.S. Cl.
CPC ....... *H01R 13/6275* (2013.01); *H01R 12/737* (2013.01)

(58) Field of Classification Search
CPC .. H01R 12/72; H01R 13/6275; H01R 12/737; H01R 13/635; G06F 1/186; H05K 7/1402
USPC .............................. 439/61, 62, 152, 153, 157
See application file for complete search history.

(56) References Cited

U.S. PATENT DOCUMENTS

| | | | | |
|---|---|---|---|---|
| 6,551,120 B2 * | 4/2003 | Daskalakis | ............. | G06F 1/185 439/157 |
| 7,121,862 B2 * | 10/2006 | Tang | .................. | H01R 12/7005 439/327 |
| 7,909,627 B2 * | 3/2011 | Hill | .................... | H01R 12/7005 439/153 |
| 8,858,257 B2 * | 10/2014 | Mo | .................. | H01R 13/62977 439/578 |
| 9,780,512 B2 * | 10/2017 | Hsu | ....................... | H01R 13/641 |
| 11,507,149 B2 * | 11/2022 | Petersen, II | ............ | G06F 1/185 |
| 11,853,131 B2 * | 12/2023 | Chen | ..................... | H05K 7/1402 |
| 11,868,187 B2 * | 1/2024 | Chen | ....................... | G06F 1/185 |
| 2005/0009396 A1 * | 1/2005 | Wu | .................... | H01R 12/7005 439/327 |

(Continued)

FOREIGN PATENT DOCUMENTS

CN 105302234 4/2019
TW M247894 10/2004

*Primary Examiner* — Hae Moon Hyeon
(74) *Attorney, Agent, or Firm* — JCIPRNET

(57) ABSTRACT

A circuit board device is adapted for inserting an expansion card with an electrical end and a locking part. The circuit board device includes a circuit board body, a slot, and a linkage structure located beside the slot. The linkage structure includes a connecting rod with a first end, a second, and an axis, a pressing part, and a fixing part. The pressing part is connected to the first end and deviates from the axis. The fixing part is located at the second end and has a hook, an elastic arm close to the slot and the hook, and a fixing member. The hook deviates from the axis and has a first slope facing away from the circuit board body. The fixing member extends from the spring arm towards the slot and includes a second slope facing away from the circuit board body and a third slope facing the hook.

11 Claims, 11 Drawing Sheets

(56) References Cited

U.S. PATENT DOCUMENTS

2016/0172772 A1\* 6/2016 Chen .................... H01R 12/737
                                                                439/62

\* cited by examiner

CIRCUIT BOARD DEVICE FOR INSERTING AN EXPANSION CARD

CROSS-REFERENCE TO RELATED APPLICATION

This application claims the priority benefit of Taiwan application serial no. 112204459, filed on May 8, 2023. The entirety of the above-mentioned patent application is hereby incorporated by reference herein and made a part of this specification.

BACKGROUND

Technical Field

The disclosure relates to a circuit board device, and in particular to a circuit board adapted for inserting an expansion card.

Description of Related Art

With the advancement of technology, the functions of electronic devices are becoming more and more diverse, and there is a need for more scalability. The direction of this research focuses on the way to quickly and conveniently configure the expansion card or remove the expansion card from the circuit board.

SUMMARY

A circuit board device of the disclosure is adapted for inserting an expansion card. The expansion card includes an electrical end and a locking part. The circuit board device includes a circuit board body, a slot, and a linkage structure. The slot is disposed on the circuit board body. The linkage structure is rotatably disposed on the circuit board body and is located beside the slot. The linkage structure includes a connecting rod, a pressing part, and a fixing part. The connecting rod has a first end and a second end opposite to each other and an axis. The pressing part is connected to the first end and deviates from the axis. The fixing part is located at the second end and has a hook, an elastic arm, and a fixing member. The hook is close to the slot and deviates from the axis, and has a first slope facing away from the circuit board body. The elastic arm is close to the slot and the hook. The fixing member extends from the elastic arm towards the slot and includes a second slope facing away from the circuit board body and a third slope facing the hook. When the electrical end is inserted in the slot, the locking part pushes against the first slope, so that the linkage structure rotates around the axis, and the hook gives way, and the locking part pushes against the second slope, and the elastic arm deforms, so that the fixing member gives way, and the expansion card is fixed between the fixing member and the hook.

As stated above, the linkage structure of the circuit board device of the disclosure is rotatably disposed on the circuit board body and is located beside the slot. The pressing part of the linkage structure is connected to the first end of the connecting rod and deviates from the axis. The hook is close to the slot and deviates from the axis, and has the first slope facing away from the circuit board body. The fixing member extends from the elastic arm towards the slot and includes the second slope facing away from the circuit board body and the third slope facing the hook. When the electrical end of the expansion card is inserted in the slot, the locking part of the expansion card pushes against the first slope, so that the linkage structure rotates around the axis, and the hook gives way, and the locking part pushes against the second slope, and the elastic arm deforms, so that the fixing member gives way, and the expansion card is fixed between the fixing member and the hook, which is quite convenient to fix the expansion card.

DESCRIPTION OF THE EMBODIMENTS

Figure 1:
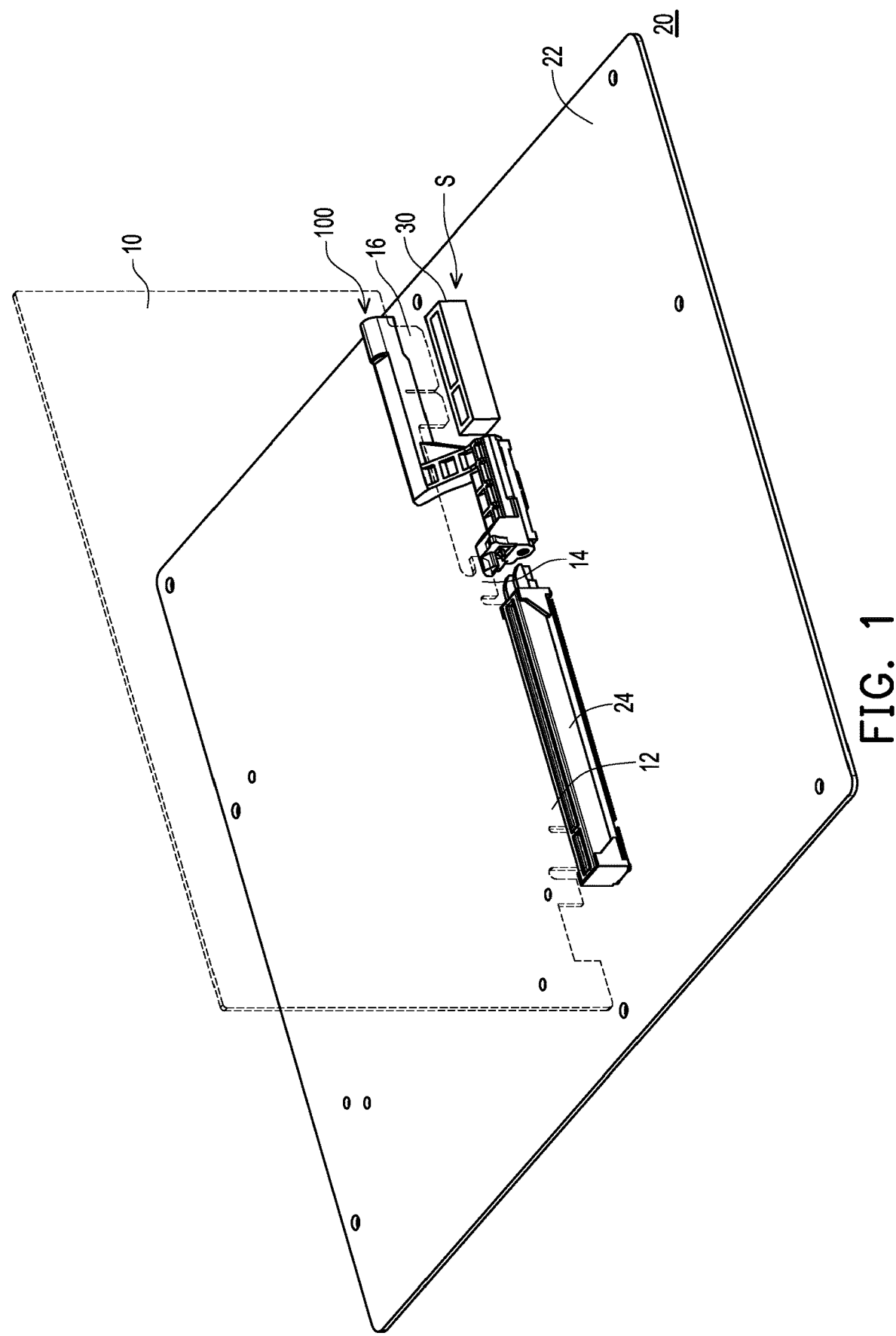
FIG. 1 is a schematic view of a circuit board device according to an embodiment of the disclosure.

Referring to FIG. 1, a circuit board device 20 in this embodiment includes a circuit board body 22, a slot 24, and a linkage structure 100. The slot 24 is disposed on the circuit board body 22. The circuit board body 22, for example, is a mainboard, and the slot 24, for example, is a Peripheral Component interconnect Express (PCI-E) slot, but the types of the circuit board body 22 and the slot 24 are not limited.

The slot 24 is adapted for inserting an expansion card 10. In this embodiment, the expansion card 10 takes a graphics card as an example, but the type of the expansion card 10 is not limited. The expansion card 10 includes an electrical end 12 and a locking part 14. The electrical end 12 is inserted in the slot 24, and the locking part 14 is used for confining the expansion card 10 to the slot 24, so that the expansion card 10 is not easily detached from the slot 24.

Figure 2:
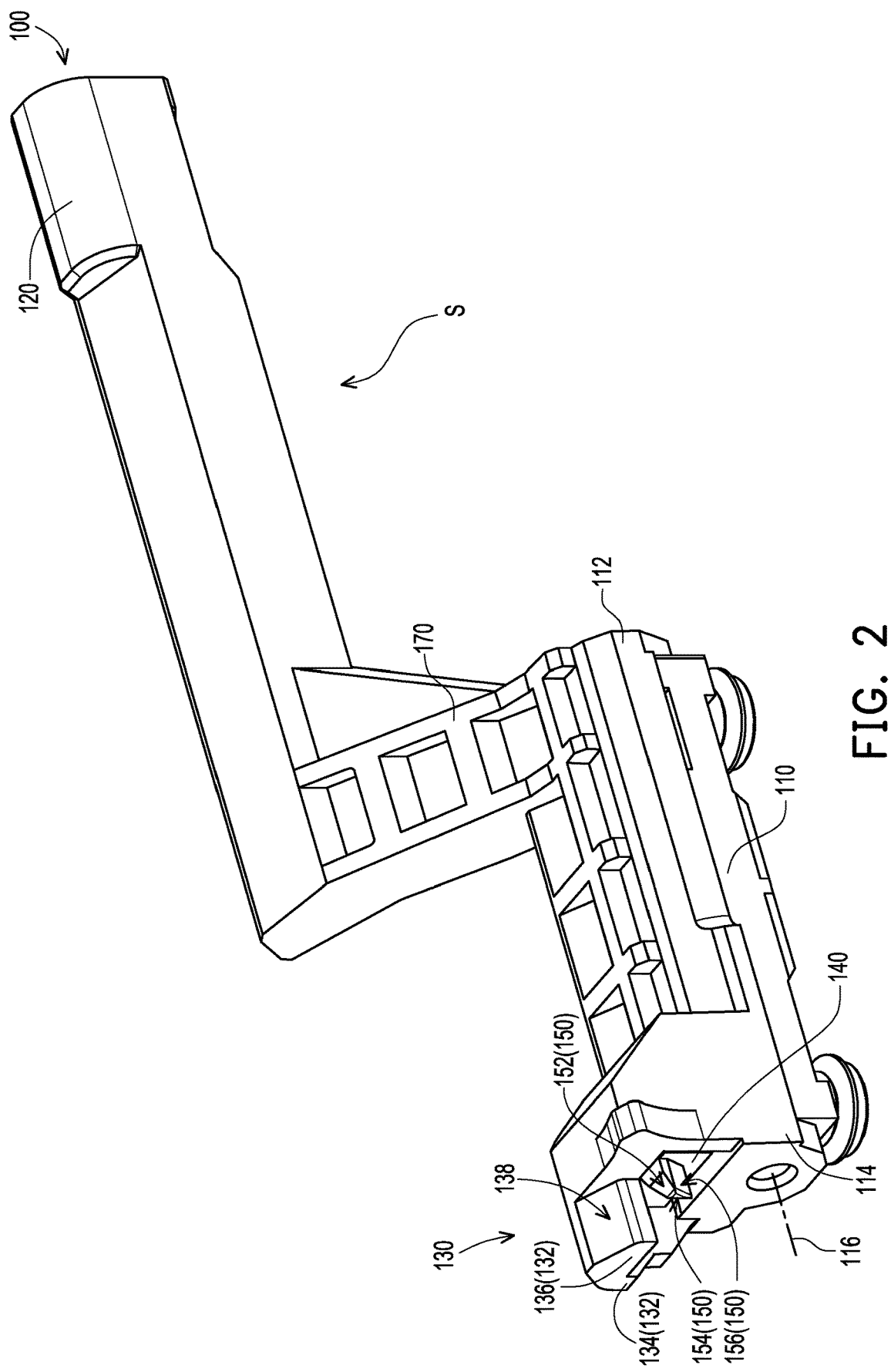
FIG. 2 is an enlarged schematic view of a linkage structure in FIG. 1.

The linkage structure 100 is rotatably disposed on the circuit board body 22 and is located beside the slot 24. In FIG. 2, the linkage structure 100 includes a connecting rod 110, a pressing part 120, and a fixing part 130. The connecting rod 110 has a first end 112 and a second end 114 opposite to each other and an axis 116. The pressing part 120 is connected to the first end 112 and deviates from the axis 116. Specifically, there is a connecting segment 170 between the connecting rod 110 and the pressing part 120. The pressing part 120 is connected to the first end 112 through the connecting segment 170. As the connecting rod 110, the connecting segment 170, and the pressing part 120 are respectively bent to be connected, the pressing part 120 deviates from the axis 116.

Referring to FIG. 1 and FIG. 2, in this embodiment, the circuit board device 20 also includes a power slot 30 disposed on the circuit board body 22. The first end 112 (FIG. 2), the connecting segment 170 (FIG. 2), and the pressing part 120 (FIG. 2) form a space S. The power slot 30 is located in the space S. That is, in this embodiment, the pressing part 120 deviates from the axis 116 to give way to the power slot 30.

Furthermore, in this embodiment, the expansion card 10 also includes a power terminal 16 aligned with the power slot 30. When the electrical end 12 of the expansion card 10 is inserted in the slot 24, the power terminal 16 is inserted in the power slot 30 at the same time, so that the circuit board body 22 transmits signals and supplies power to the expansion card 10. Of course, in other embodiments, the space S may also be configured with other components, and there is no limitation.

Figure 3:
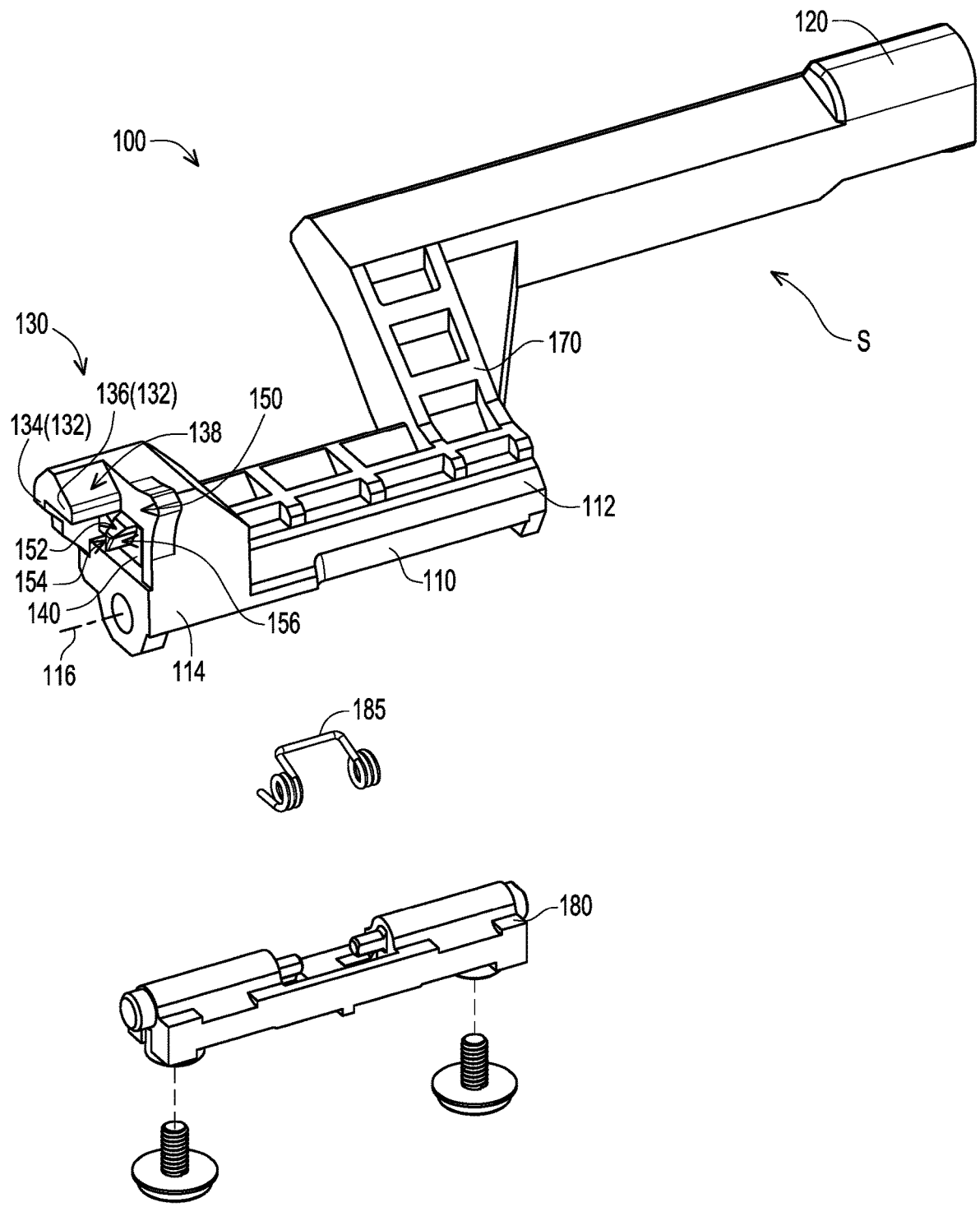
FIG. 3 is an exploded view of FIG. 2

Referring to FIG. 3, in this embodiment, circuit board device 20 also includes a stand 180 and a torsional spring 185. The stand 180 is fixed to the circuit board body 22 (FIG. 1). The connecting rod 110 is rotatably disposed on the stand 180 with the axis 116 as the axis of rotation. The torsional spring 185 is located between the stand 180 and the connecting rod 110, two ends of the torsional spring 185 are connected to the stand 180, and a central part of the torsional spring 185 is connected to the connecting rod 110, so that the linkage structure 100 may be taken back by the torsional spring 185 after being rotated relative to the stand 180. In other embodiments, one end of the torsional spring 185 may also be connected to the stand 180, and the other end may be connected to the connecting rod 110.

Additionally, in this embodiment, the material of the linkage structure 100 is plastic, for example. To enhance the structural strength, the material of the connecting segment 170 or the pressing part 120 may be metal.

Figure 4:
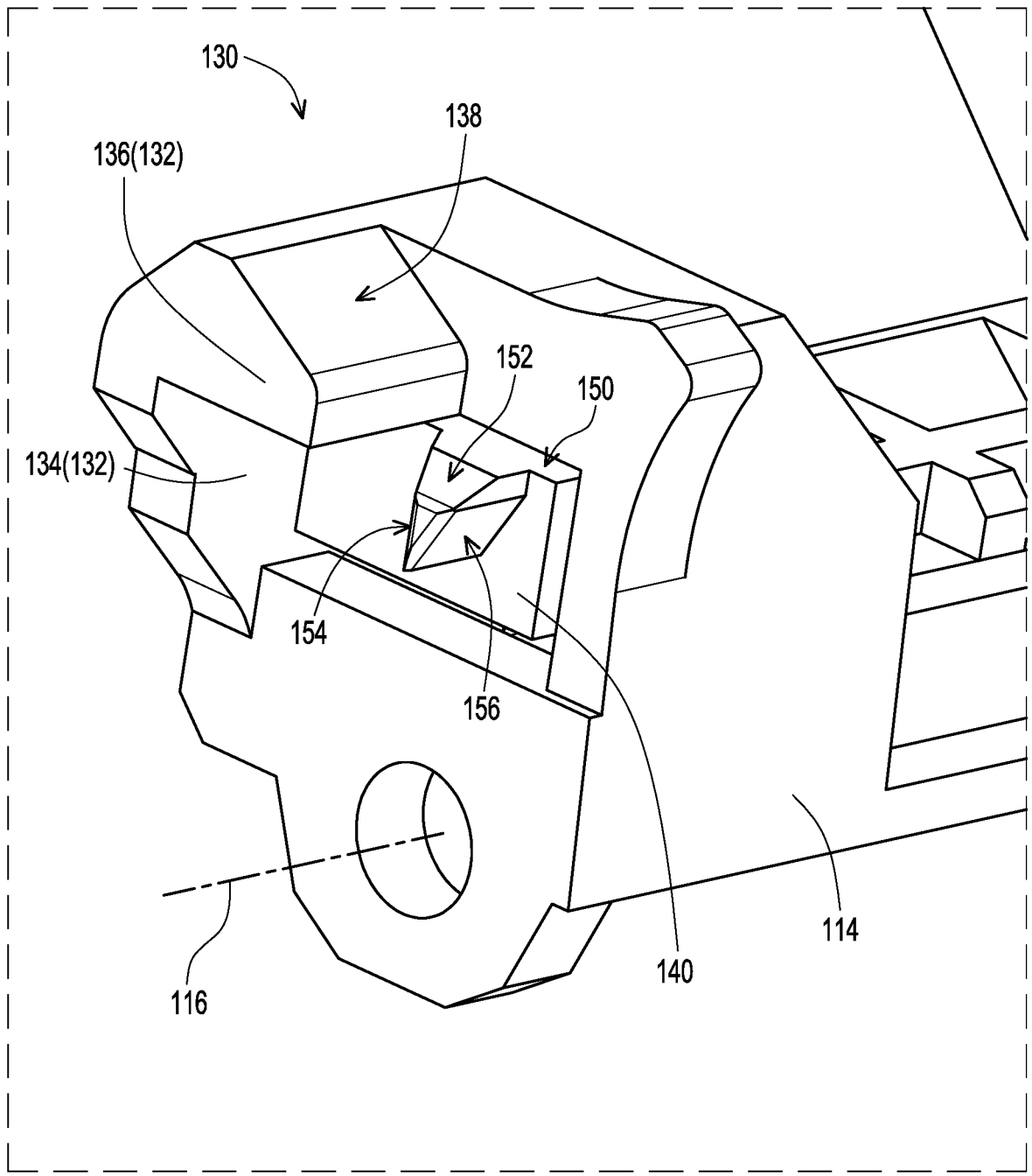
FIG. 4 is a partial enlarged schematic view of a fixing part in FIG. 3.

Referring to FIG. 4, the fixing part 130 of the linkage structure 100 is located at the second end 114 and has a hook 132, an elastic arm 140, and a fixing member 150. The hook 132 is close to the slot 24 (FIG. 1) and deviates from the axis 116, and has a first slope 138 facing away from the circuit board body 22 (FIG. 1). The elastic arm 140 is close to the slot 24 (FIG. 1) and the hook 132. The elastic arm 140 has a fixing end close to the hook 132 and a free end away from the hook 132.

The fixing member 150 extends from the elastic arm 140 towards the slot 24 (FIG. 1) and includes a second slope 152 facing away from the circuit board body 22, a third slope 154 facing the hook 132, and an abutting surface 156 opposite to the third slope 154. The hook 132 includes a handle part 134 and a hook part 136. An end of the elastic arm 140 is connected to the handle part 134. The third slope 154 faces the handle part 134. The hook part 136 extends from the handle part 134 towards the fixing member 150.

Figure 5:
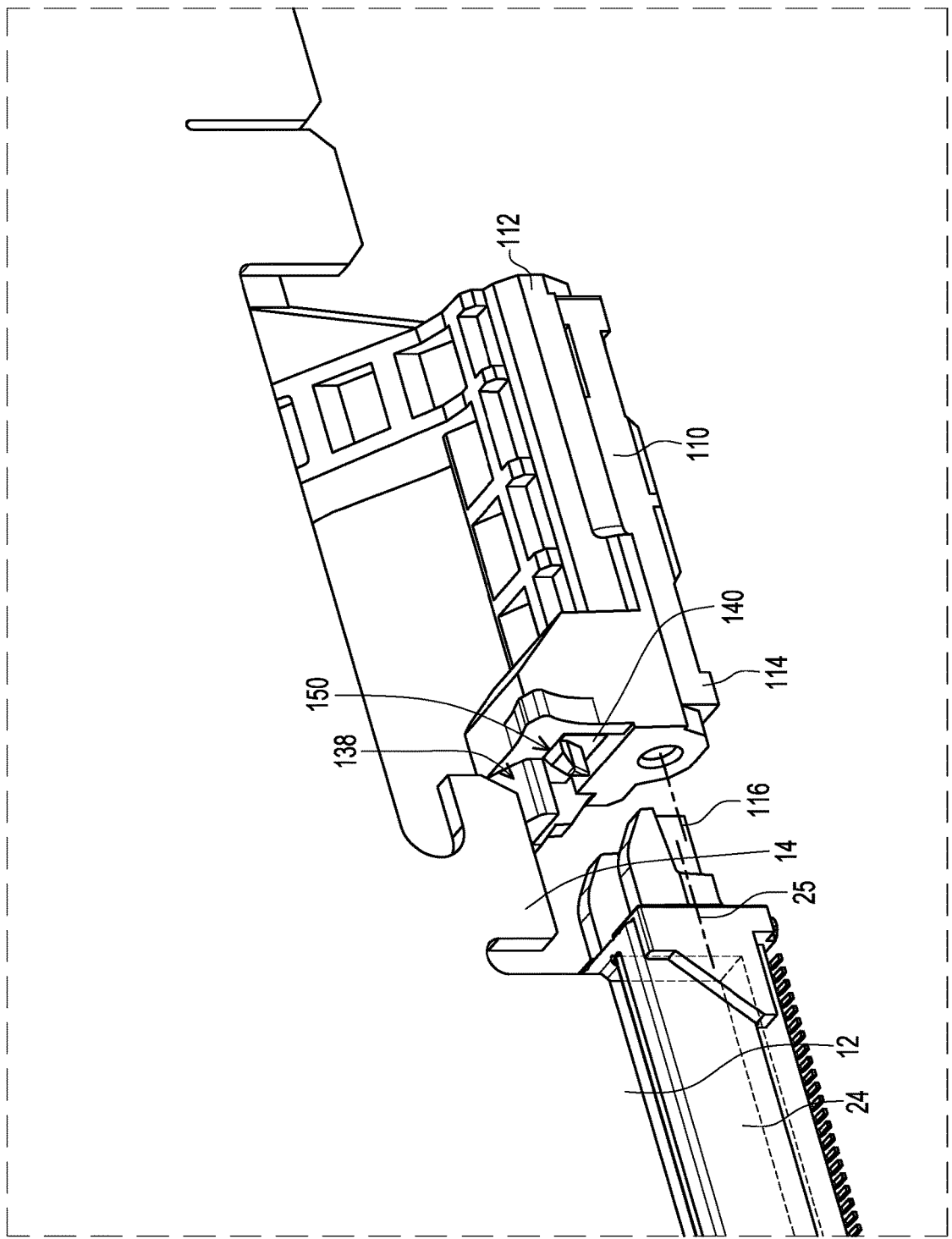
FIG. 5 is a partial enlarged schematic view of FIG. 1.
Figure 6:
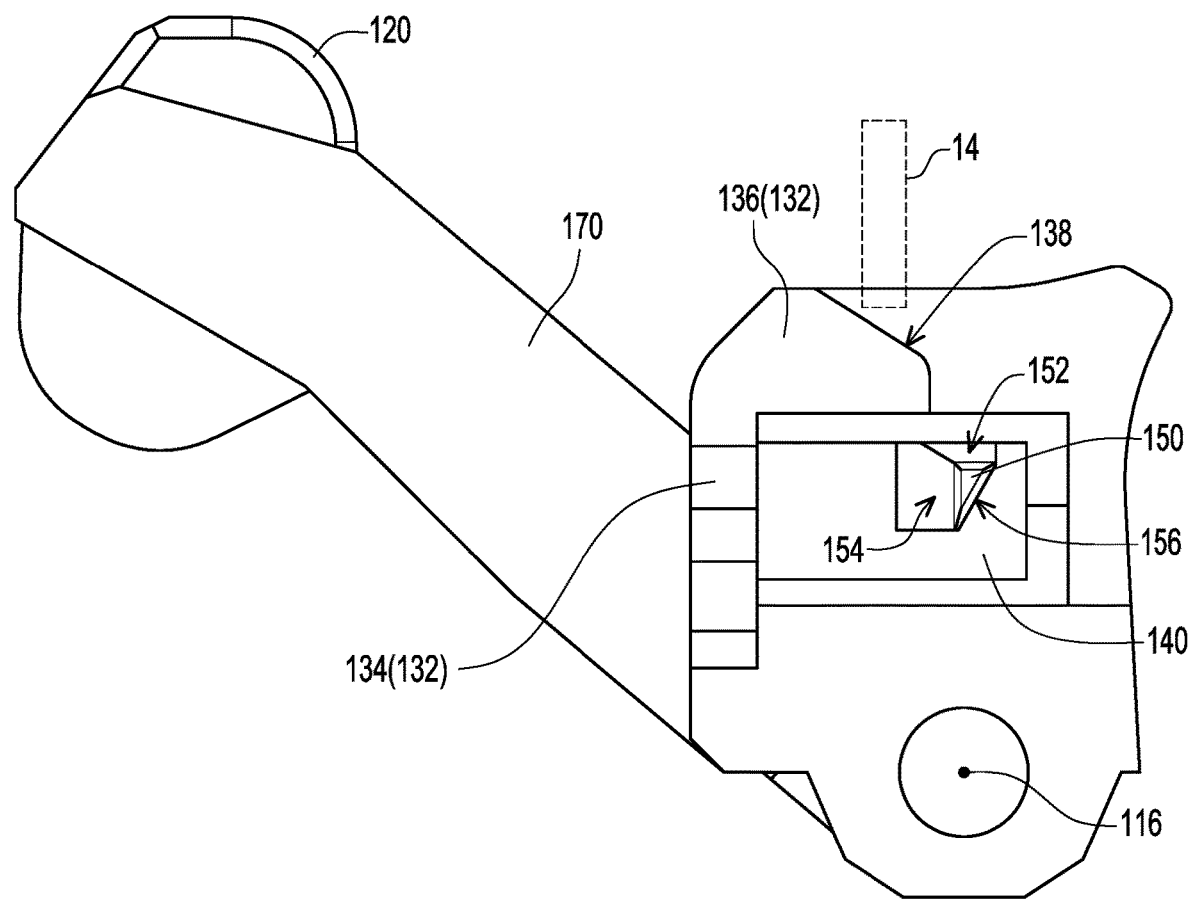
FIG. 6 is a schematic view of the linkage structure and a locking part in FIG. 5 from another viewing angle.

Referring to FIG. 5 and FIG. 6, at this time, the locking part 14 of the expansion 10 is still above the third slope 154 of the hook 132 and is not yet in contact with the third slope 154. As shown in FIG. 6, in this embodiment, the hook 132 is located on the top left of the axis 116, not directly above the axis 116 to be staggered from the axis 116. This design enables the linkage structure 100 to rotate with the axis 116 as the axis of rotation when the locking part 14 subsequently pushes down the first slope 138 of the hook 132. Additionally, as presented in FIG. 5, the slot 24 has an extension line 25. The extension line 25 is staggered from and parallel to the axis 116. That is, the position of the expansion card 10 after being inserted in the slot 24 is staggered from the axis 116, so that the hook 132 rotated back can limit the position of the locking part 14. The following is a detailed description of the locking process.

Figure 7:
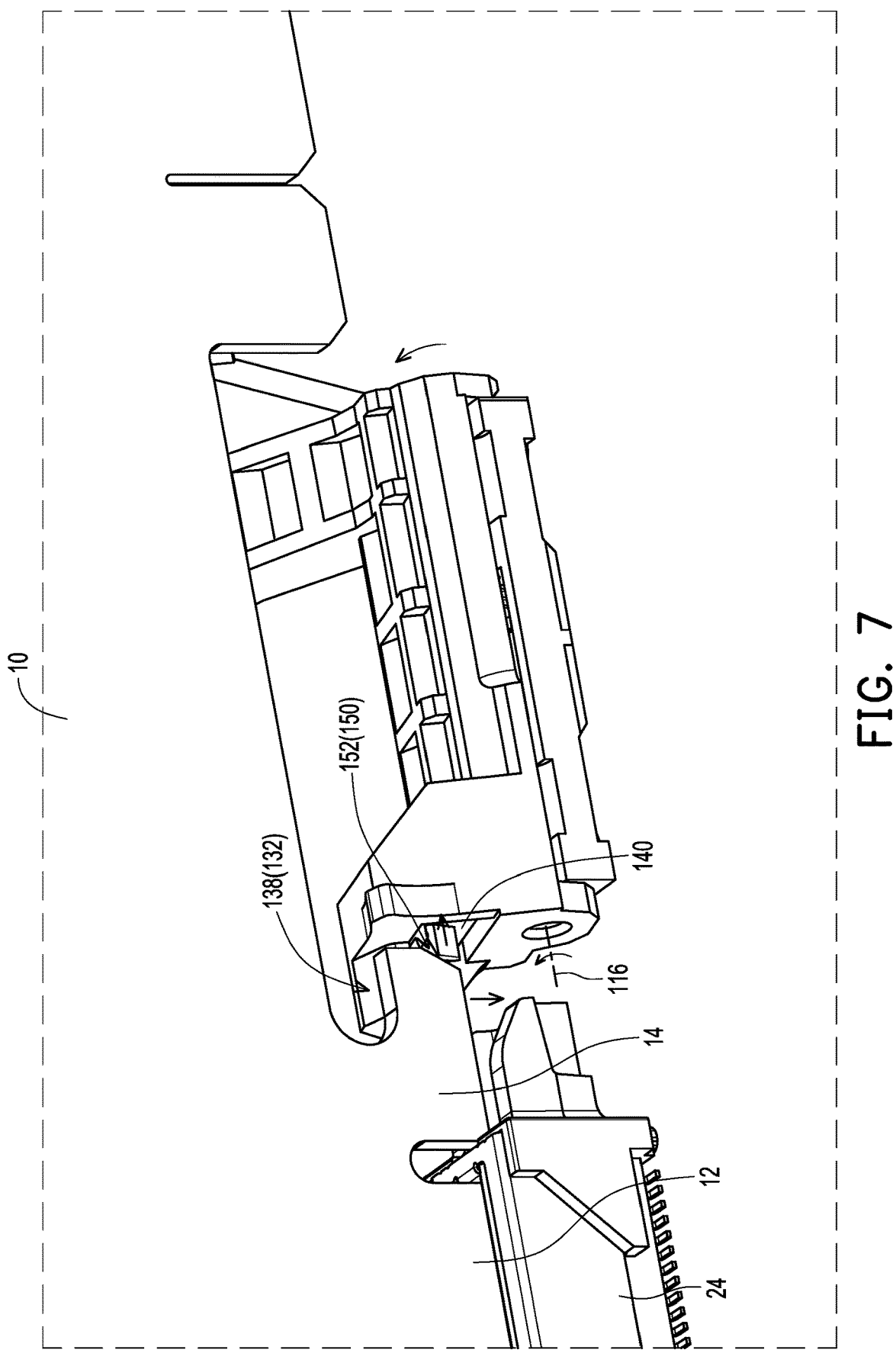
FIG. 7 and FIG. 8 are partial enlarged schematic views of the locking part moving down and the linkage structure.

As shown in FIG. 7, the locking part 14 moves down and pushes against the first slope 138, so that the linkage structure 100 rotates with the axis 116 as the axis of rotation, and the hook 132 gives way. As the linkage structure 100 rotates, the fixing member 150 rotates below the locking part 14. When moving down, the locking part 14 pushes against the second slope 152 of the fixing member 150. Since the fixing member 150 is located on the elastic arm 140, the elastic arm 140 deforms backwards, so that the fixing member 150 gives way, and the locking part 14 can continue moving down. In this process, the torsional spring 185 (FIG. 3) accumulates elasticity, and the expansion card 10 continues moving down until the electrical end 120 is inserted in the slot 24.

Figure 8:
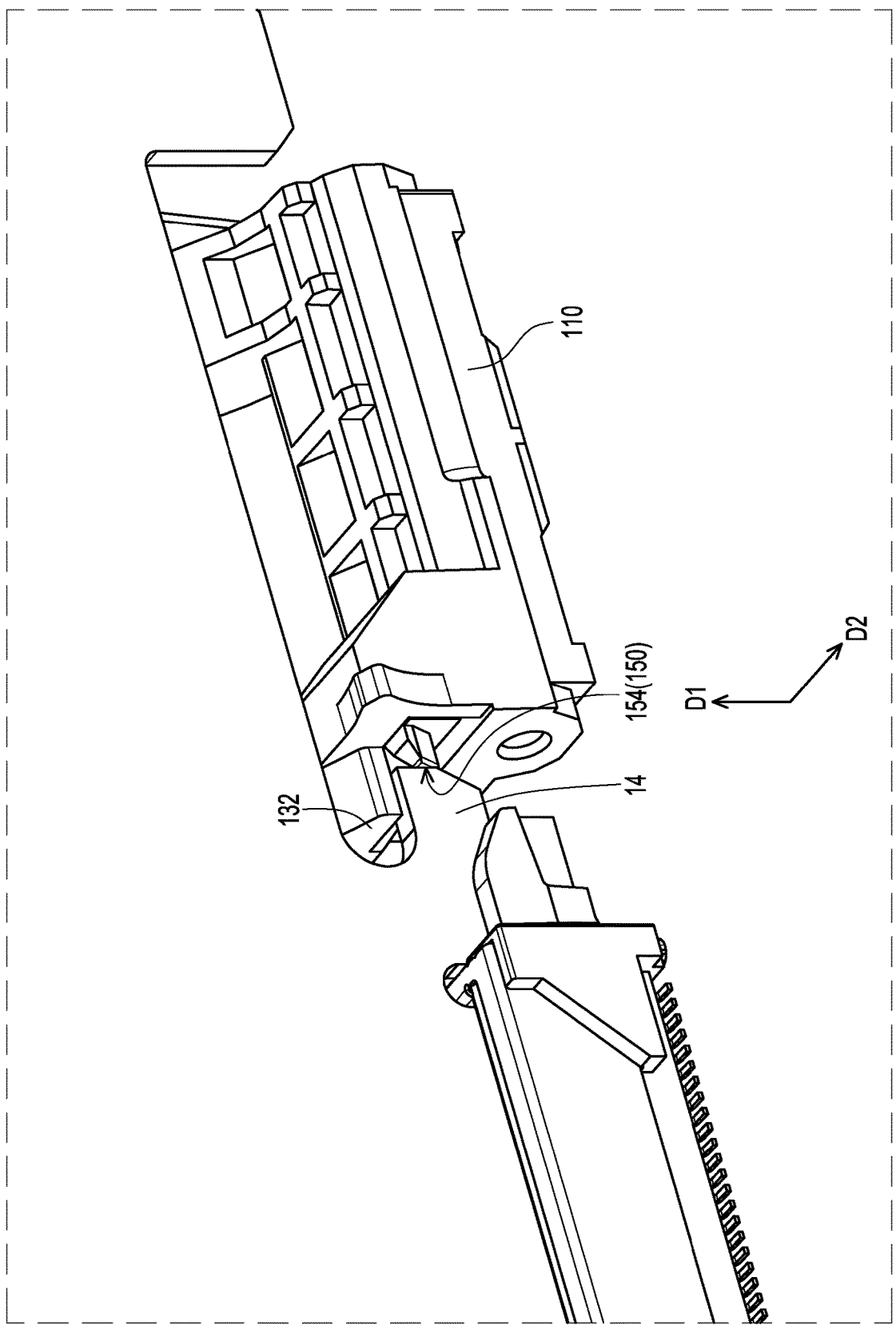
Figure 9:
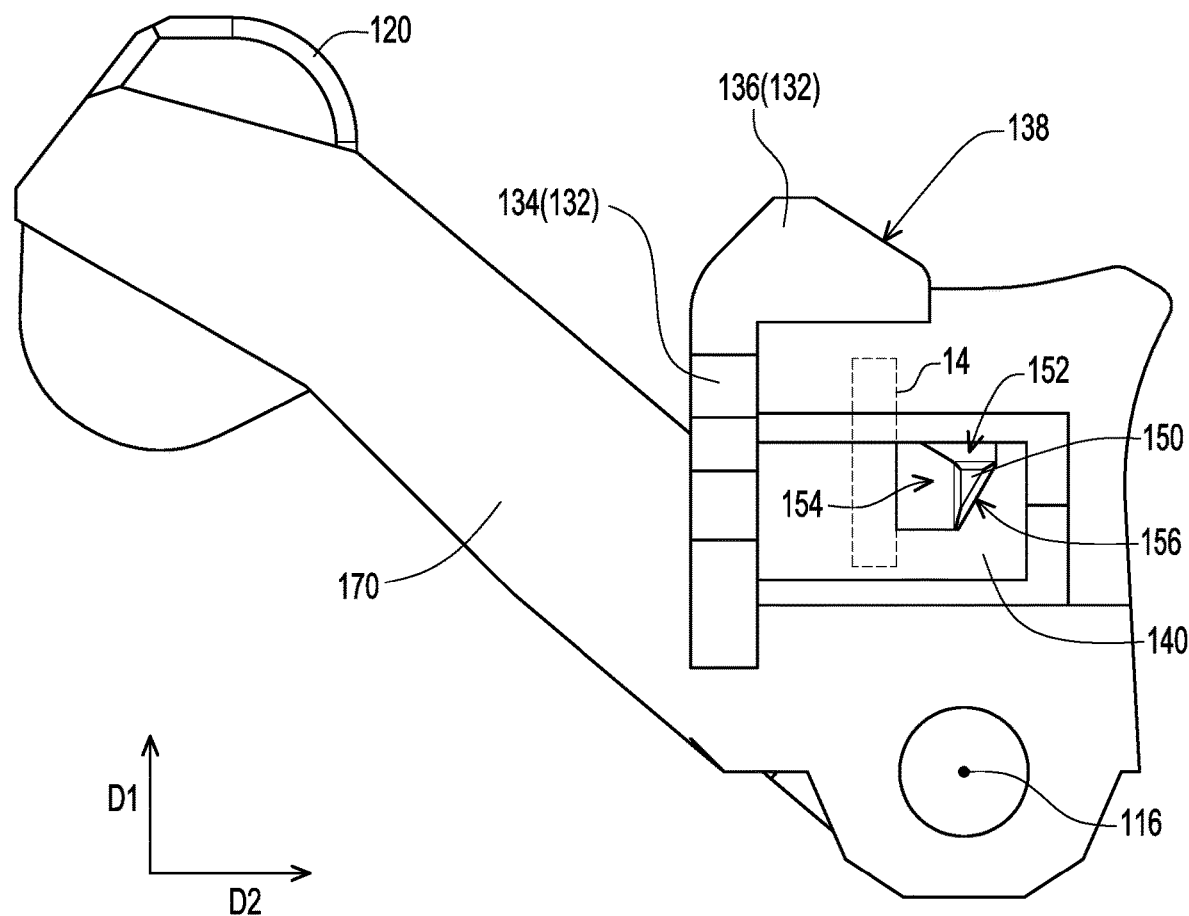
FIG. 9 is a schematic view of the linkage structure and the locking part in FIG. 8 from another viewing angle.

As presented in FIG. 8 and FIG. 9, when the locking part 14 of the expansion card 10 moves down without being in contact with the first slope 138 of the hook part 136 and the second slope 152 of the fixing member 150, the linkage structure 100 is not interfered by the locking part 14. The torsional spring 185 (FIG. 3) releases the accumulated elasticity and brings the linkage structure 100 back to the original position, so that the hook 132 reversely rotates back to the top of the locking part 14. At this time, the hook 132 limits the locking part 14 from moving towards a first direction D1 (FIG. 8) away from the circuit board body 22, and the locking part 14 is located beside the third slope 154 and is limited by the fixing member 150 in a second direction D2 (FIG. 8), so that the expansion card 10 is fixed between the fixing member 150 and the hook 132.

As shown in FIG. 9, at this stage, the locking part 14 of the expansion card 10 is located between the handle part 134 and the third slope 154. The hook 132 and the locking part 14 deviate from the axis 116 in the up and down direction and are located at the same side of the axis 116. At this time, if the hook part 136 unexpectedly moves up, the hook part 136 generates a torque about the axis 116 in a clockwise direction, the locking part 14 pushes the hook part 136 upwards, and the hook part 136 also generates a torque about the axis 116 in the clockwise direction, so that the hook 36 can be hooked tightly without being pushed upwards by the locking part 14 to move away from the top of the locking part 14. Therefore, the expansion card 10 (FIG. 1) can be fixed securely.

To lift the limitation on the position of the locking part 14 by the linkage structure 100, only the pressing part 120 of FIG. 1 needs to be pressed. The pressing part 120 is forced to rotate the linkage structure 100 with the connecting rod 110 as the axis, the hook 132 gives way and lifts the limitation on the position of the locking part 14 in the first direction D1, and the third slope 154 (FIG. 9) moves along the locking part 14, so that the elastic arm 140 deforms and gives way, and the fixing member 150 lifts the limitation on the position of the locking part 14 in the second direction D2 (FIG. 8).

Figure 10:
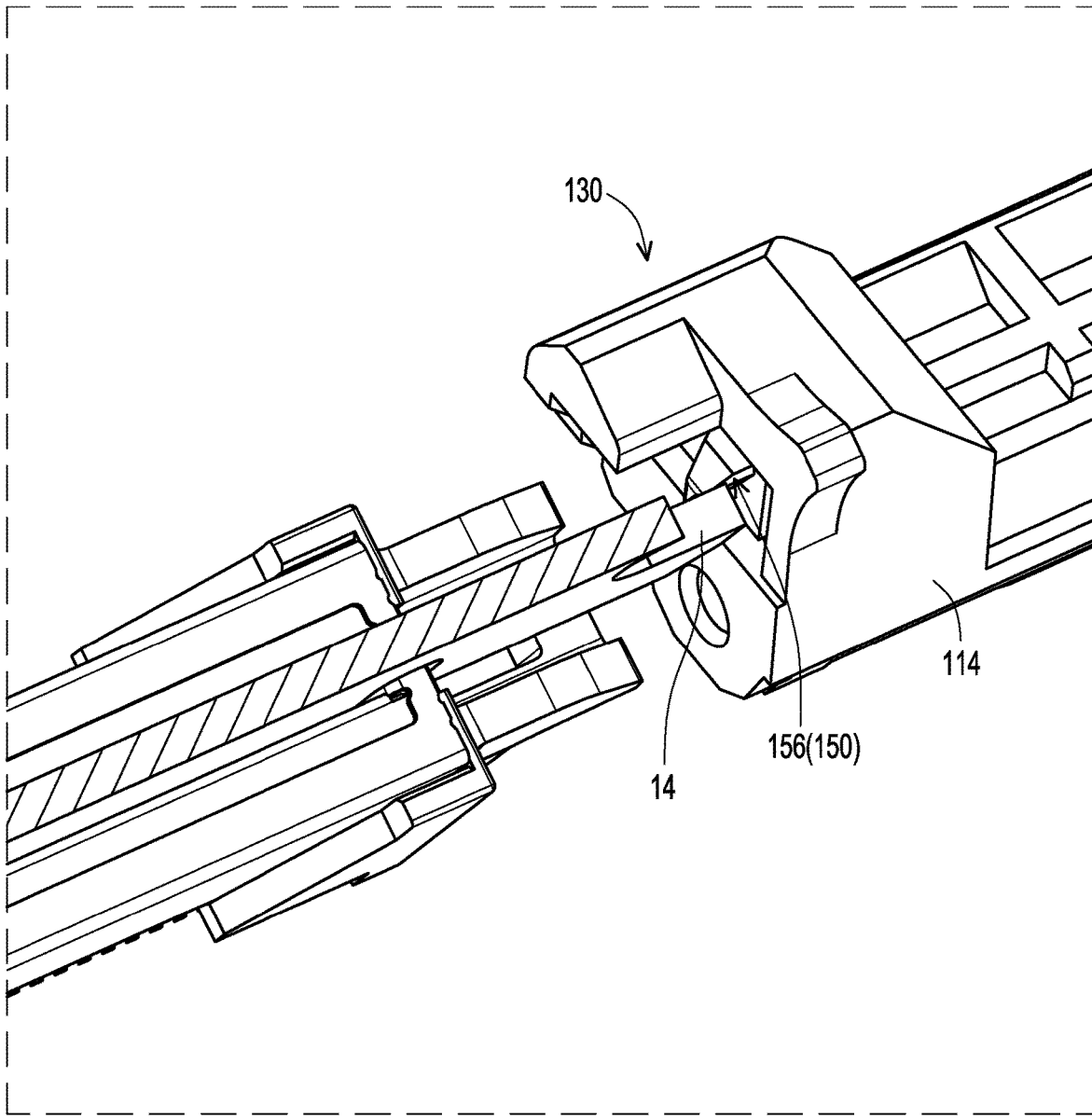
FIG. 10 is a partial enlarged schematic view of the locking part and the fixing part after a pressing part is pressed.

After the third slope 154 leaves the locking part 14 and the elastic arm 140 returns, as shown in FIG. 10, the abutting surface 156 of the fixing part 130 abuts against the locking part 14, so that the linkage structure 100 (FIG. 10) maintains a rotary state. This design prevents a user from pressing the pressing part 120 all the time, and the connecting rod 110 maintains the rotary state, so that the user may slowly pull out the expansion card 10.

Figure 11:
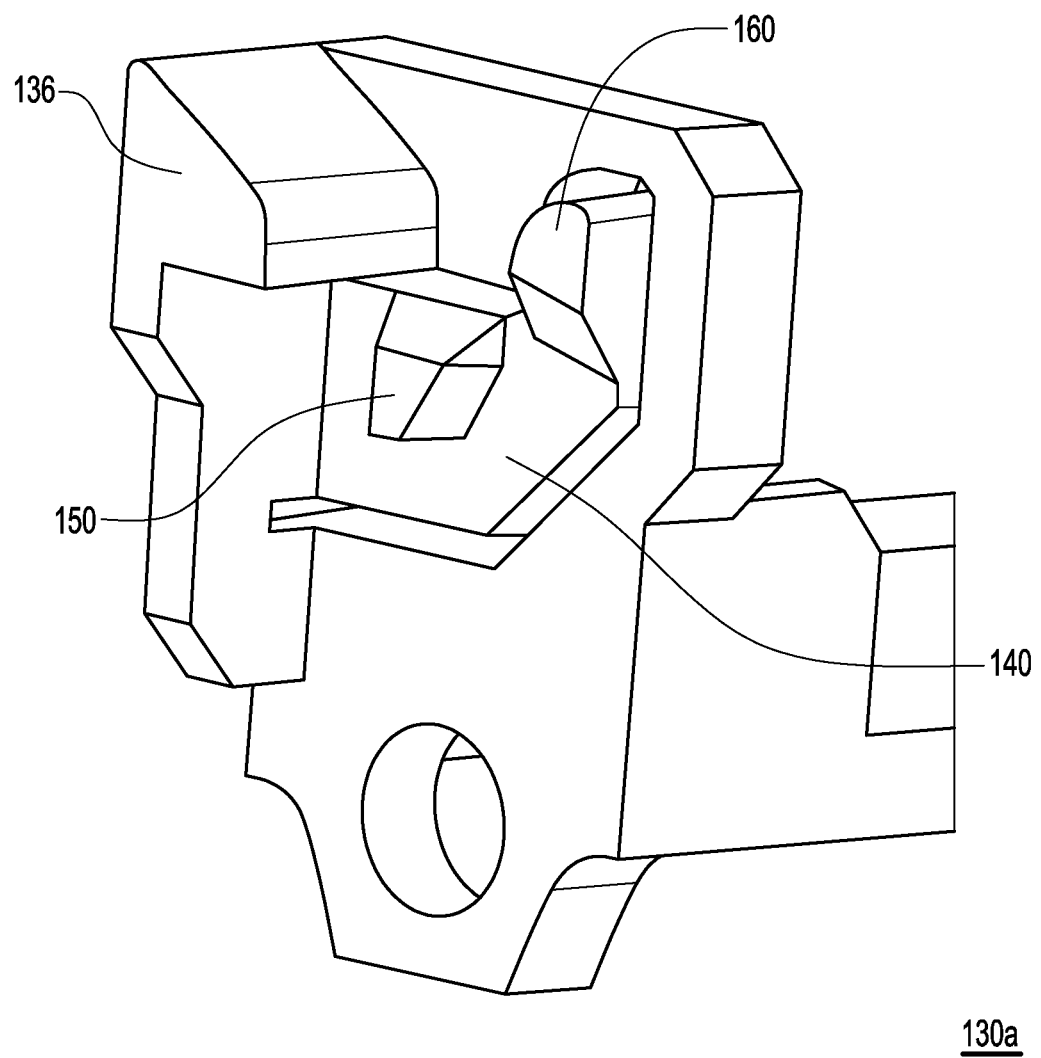
FIG. 11 is a schematic view of a fixing part in FIG. 1 according to another embodiment of the disclosure.

Referring to FIG. 11, the difference between a fixing part 130a in this embodiment and the fixing part 130 of the foregoing embodiment is that the fixing part 130a in this embodiment also includes a limiting part 160 located on the elastic arm 140, the fixing member 150 is located between the hook part 136 and the limiting part 160, and the fixing member 150 is closer to the circuit board body 22 (FIG. 1) than the hook part 136 and the limiting part 160. The limiting part 160 is used for limiting a track of the locking part 14 when moving down to prevent the locking part 14 from being too far away from the hook part 136 and unable to be pushed down to the hook part 136 to rotate the hook part 136.

As described above, the linkage structure of the circuit board device in the disclosure is rotatably disposed on the circuit board body and is located beside the slot. The pressing part of the linkage structure is connected to the first end of the connecting rod and deviates from the axis. The hook is close to the slot and deviates from the axis, and has the first slope facing away from the circuit board body. The fixing member extends from the elastic arm towards the slot and includes the second slope facing away from the circuit board body and the third slope facing the hook. When the electrical end of the expansion card is inserted in the slot, the locking part of the expansion card pushes against the first slope, so that the linkage structure rotates around the axis, and the hook gives way, and the locking part pushes against the second slope, and the elastic arm deforms, so that the fixing member gives way. When the linkage structure returns, the hook restricts the locking part from moving in the first direction away from the circuit board body, and the locking part is located beside the third slope and is limited in the second direction, so that the expansion card is fixed between the fixing member and the hook. Therefore, the expansion card can be fixed conveniently and securely.

In addition, when the pressing part is forced, so that the linkage structure rotates with the connecting rod as the axis, the hook gives way and lifts the limitation on the position of the locking part in the first direction, and the third slope moves along the locking part, so that the elastic arm deforms, and the fixing member lifts the limitation on the position of the locking part in the second direction. As the pressing part is away from the slot, the pressing part is not blocked by structures near the slot, so the user can unlock by pressing smoothly. Therefore, the expansion card can be easily removed. Additionally, as the pressing part deviates from the axis, when the pressing part is pressed downwards, the linkage structure lifts the limitation on the position of the locking part by rotating so the whole structure is relatively simple and requires fewer components.

What is claimed is:

1. A circuit board device, adapted for inserting an expansion card, wherein the expansion card comprises an electrical end and a locking part, the circuit board device comprising:
    a circuit board body;
    a slot, disposed on the circuit board body; and
    a linkage structure, rotatably disposed on the circuit board body and located beside the slot, the linkage structure comprising:
        a connecting rod, having a first end and a second end opposite to each other and an axis;
        a pressing part, connected to the first end and deviating from the axis; and
        a fixing part, located at the second end and having:
            a hook, close to the slot and deviating from the axis, and having a first slope facing away from the circuit board body;
            an elastic arm, close to the slot and the hook; and
            a fixing member, extending from the elastic arm towards the slot and comprising a second slope facing away from the circuit board body and a third slope facing the hook,
    wherein when the electrical end is inserted in the slot, the locking part pushes against the first slope, so that the linkage structure rotates around the axis, and the hook gives way, and the locking part pushes against the second slope, and the elastic arm deforms, so that the fixing member gives way, and the expansion card is fixed between the fixing member and the hook.

2. The circuit board device according to claim 1, wherein when the linkage structure returns, the hook restricts the locking part from moving in a first direction away from the circuit board body, and the locking part is located beside the third slope and is limited in a second direction by the fixing member, so that the expansion card is fixed between the fixing member and the hook.

3. The circuit board device according to claim 2, wherein when the pressing part is forced to rotate the linkage structure with the connecting rod as an axis, the hook gives way and lifts limitation on a position of the locking part in the first direction, and the third slope moves along the locking part, so that the elastic arm deforms and gives way, and the fixing member lifts limitation on a position of the locking part in the second direction.

4. The circuit board device according to claim 1, wherein the fixing member further comprises an abutting surface opposite to the third slope, and after the third slope leaves the locking part and the elastic arm returns, the abutting surface abuts against the locking part, so that the linkage structure maintains a rotary state.

5. The circuit board device according to claim 1, wherein the hook comprises a handle part and a hook part, an end of the elastic arm is connected to the handle part, the third slope faces the handle part, and the hook part extends from the handle part to the fixing member.

6. The circuit board device according to claim 5, wherein when the electrical end of the expansion card is inserted in the slot and the linkage structure returns, the locking part of the expansion card is located between the handle part and the third slope, and the hook and the locking part are located at a same side of the axis.

7. The circuit board device according to claim 5, wherein the fixing part further comprises a limiting part located on the elastic arm, the fixing part is located between the hook part and the limiting part, and the fixing member is closer to the circuit board body than the hook part and the limiting part.

8. The circuit board device according to claim 1, wherein the slot comprises an extension line, and the extension line is staggered from and parallel to the axis.

9. The circuit board device according to claim 1, further comprising a power slot disposed on the circuit board body, there is a connecting segment between the connecting rod and the pressing part, the first end, the connecting segment, and the pressing part form a space, and the power slot is located in the space.

10. The circuit board device according to claim 1, further comprising a stand fixed to the circuit board body, and the connecting rod is disposed on the stand.

11. The circuit board device according to claim 10, wherein the stand is provided with a torsional spring, and the torsional spring is connected between the stand and the connecting rod.

* * * * *